United States Patent [19]

Pampalone et al.

[11] 4,262,083
[45] Apr. 14, 1981

[54] POSITIVE RESIST FOR ELECTRON BEAM AND X-RAY LITHOGRAPHY AND METHOD OF USING SAME

[75] Inventors: Thomas R. Pampalone, Griggstown; Nitin V. Desai, Somerset; Eugene S. Poliniak, Willingboro, all of N.J.

[73] Assignee: RCA Corporation, New York, N.Y.

[21] Appl. No.: 76,673

[22] Filed: Sep. 18, 1979

[51] Int. Cl.³ .............................................. B05D 3/06
[52] U.S. Cl. ...................................... 430/296; 427/35; 427/36; 427/43.1; 427/273; 428/199; 430/326; 430/921; 430/922; 430/967; 528/382
[58] Field of Search ................ 427/35, 36, 43.1, 264, 427/270, 271, 273; 430/296, 326, 921, 922, 967; 428/199, 901; 528/382

[56] References Cited

U.S. PATENT DOCUMENTS

| | | | |
|---|---|---|---|
| 3,884,696 | 5/1975 | Bowden et al. | 430/326 |
| 3,893,127 | 7/1975 | Kaplan et al. | 346/1 |
| 3,898,350 | 8/1975 | Gipstein et al. | 430/296 |
| 3,935,331 | 1/1976 | Poliniak et al. | 430/326 X |
| 3,935,332 | 1/1976 | Poliniak et al. | 430/326 X |
| 4,061,829 | 12/1977 | Taylor | 428/451 |

*Primary Examiner*—Bruce H. Hess
*Attorney, Agent, or Firm*—Birgit E. Morris; Edward J. Sites

[57] ABSTRACT

Copolymers of an aziridine and sulfur dioxide are disclosed which are useful as positive radiation resists for use in electron beam and x-ray lithography.

8 Claims, No Drawings

POSITIVE RESIST FOR ELECTRON BEAM AND X-RAY LITHOGRAPHY AND METHOD OF USING SAME

This invention relates to a new class of polymers and to a method for utilizing these polymers to make patterned relief images. In particular, the present invention relates to the use of the new class of polymers which are useful as positive electron beam and x-ray resists in the manufacture of microelectronic circuits.

BACKGROUND OF THE INVENTION

Over the past years there has been a revolution in the electronics industry in which the physical size of circuits has been dramatically reduced. Using current technology it is possible to form on a substrate or chip only a few millimeters square 1000 or more circuits. Each circuit formed on the chip may contain numerous transistors, capacitors, resistors and the like. The miniaturization of the circuits has resulted in a sharp decrease in the cost of manufacturing the circuits, and a substantial increase in the speed at which logic functions can be performed by the circuits.

The rapid progress which has been made in the miniaturization of electronic circuits has been the result of the development of fabrication prodedures which allow extremely accurate reproduction of very small circuits on the surface of the substrate.

A process which has heretofore been utilized to reproduce the desired circuits on the chips is photolithography. In photolithography a polymeric film which is sensitive to light, generally termed a photoresist, is applied to a support substrate. The film is then exposed to light through a mask which defines a pattern desired to be reproduced on the support. The term light, as used in this specification, refers to light in the visible range and ultraviolet radiation. Exposure of the photoresist results in a difference in solubility between the exposed and unexposed portions. A solvent is used to remove the more soluble portion of the photoresist and a surface relief pattern is obtained. Then, by using suitable etchants, or the like, desired features can be produced on or in the substrate.

It has been found that an electron beam can be used to delineate circuits with greater resolution than that which can be obtained with light. The higher resolution of the electron beam is due, in part, to the fact that an electron beam can be more precisely focused than can a light beam. The electron beam has been proven commercially, and continues to be a viable and important tool for the manufacture of microelectronic circuits and masks for forming printed circuits by other methods.

A more recent approach, which is still under active development, is the use of x-ray radiation to obtain the fine-line resolution required in microelectronic circuits.

One of the factors which, to date, has inhibited the full utilization of electron beam and x-ray lithography in the manufacture of microelectronic circuits is the limitations of the resists which have heretofore been available.

Materials which are suitable for use as resists in either electron beam or x-ray lithography must be carefully selected. The first requirement is that the material must be soluble in a solvent so that it can be applied as a thin film on the supporting substrate. It likewise must have sufficient adhesion to form a tight bond with the substrate. The most important property, however, is that as a result of exposure to the selected type radiation there is a substantial change in the solubility of the exposed and unexposed portions. This is important in that when a solvent, commonly called a developer, is applied to the exposed film of resist, it must selectively dissolve and remove substantially all of the more soluble portion to provide the desired surface relief pattern.

Various polymeric compositions have heretofore been suggested as candidates for resists. In U.S. Pat. No. 3,893,127 there is a disclosure of copolymers of an olefin and sulfur dioxide for use as an electron beam resist. In U.S. Pat. No. 4,061,829 there is a disclosure of chlorine- or bromine-substituted olefins and, in particular, acrylates for use as electron beam and x-ray resists.

SUMMARY OF THE INVENTION

In accordance with the present invention it has been found that certain copolymers of an aziridine and sulfur dioxide are excellent positive resists for use in electron beam and x-ray lithography.

DETAILED DESCRIPTION OF THE INVENTION

The copolymers which have been found useful as electron beam and x-ray resists in accordance with this invention are copolymers of an aziridine monomer and sulfur dioxide.

The aziridine monomers which are useful in this invention are represented by the formula

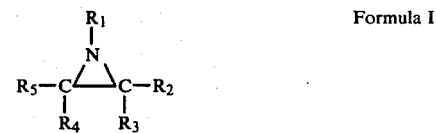

Formula I wherein $R_1$–$R_5$ are the same or different and each is a member selected from the group consisting of hydrogen, alkyl, aralkyl, and aryl. The groups $R_1$–$R_5$ can be straight chain, branch chain, or cycloalkyls. The substituents $R_1$–$R_5$ can be further substituted with substituents which do not adversely affect the polymerization reaction with sulfur dioxide or the reaction which occurs on exposure to radiation. Advantageously, the substituents include radicals which increase the sensitivity to certain wavelength radiation.

The aziridine monomers which are most advantageously employed in this invention are those of Formula I wherein $R_1$–$R_5$ are each selected from the group consisting of hydrogen, alkyl having 1–12 carbon atoms, aralkyl having 7–12 carbon atoms, and aryl having 6–12 carbon atoms.

The monomers which are particularly useful in the manufacture of positive-acting resists, i.e. resists that become more soluble where irradiated, are those in which the groups $R_1$–$R_5$ are hydrogen or lower alkyl having 1–4 carbon atoms. The sensitivity of the copolymer is even greater when at least one of the substituents on each of the carbon atoms of the monomer is hydrogen, that is, when $R_3$ and $R_4$ are hydrogen in Formula I. If the film of the copolymer is intended to be employed as a resist for x-ray lithography, it is preferable that at least one of substitutents $R_1$–$R_5$ be a lower alkyl which is substituted with halogen, preferably chlorine, with the remainder of the groups $R_1$–$R_5$ being hydrogen or lower alkyl (1–4 carbon atoms). The compounds of this class when subjected to x-ray radiation are especially active at certain wavelengths depending upon the particular halogen selected and the particular type of target utilized in the x-ray exposure. When the polymer has chlorine substituents on the alkyl groups and a palladium target is employed, the polymer will preferentially absorb x-ray radiation at 4.37 angstroms. The copolymer which is obtained is believed to be comprised of repeating units of the formula

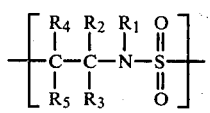

Formula II wherein $R_1$–$R_5$ have the meanings assigned above. It is believed when the film of the copolymer is subjected to exposure by radiation, that the polymer chain breaks between the nitrogen and sulfur atoms of the linkage shown in Formula II.

The aziridine monomers can be prepared in accordance with well known processes and certain of the monomers are readily available from commercial sources.

The above-described polymers can be prepared by gradually adding the aziridine monomer to an excess amount of liquid sulfur dioxide. The reaction is conducted at reduced temperatures, for example $-70°$ C., and in an inert atmosphere. The polymer which is obtained will solidify at room temperature and can be ground and dissolved in a suitable solvent for application as a film to a substrate to be treated in accordance with this invention.

The copolymers of this invention are especially useful as recording medium for use in electron beam and x-ray lithography. To prepare the medium, the copolymer is dissolved in a solvent and then is solution-cast or spun-coated onto a support. The support which is used is conventional and does not form a part of this invention. The thickness of the film deposited on the support is controlled by the concentration of the polymer in the solvent. The solvent is removed from the deposited film by drying, evaporation or the like.

The recording medium prepared as described above can be exposed by an electron beam or x-ray radiation. When an electron beam is used, the recording medium is preferably exposed by using a scanning electron beam to expose those portions of the resist to produce the desired surface relief pattern in the resist. When x-rays are employed as the exposure means, the recording medium is exposed through a mask having an image which defines the pattern desired to be reproduced in the resist.

The recording medium, after exposure, is developed in a suitable solvent or mixture of solvents which selectively dissolves the exposed portion of the resist. The relief image which is obtained can thereafter be used as a pattern in subsequent etching and deposition steps to produce the desired miniaturized circuits.

The following Example is given by way of further illustration of this invention and is not intended to limit in any way the scope of the present invention beyond that of the appended claims.

EXAMPLE 1

About 15 ml of liquid $SO_2$ was placed in a reaction tube maintained at $-70°$ C. with acetone/dry ice. The system was continuously flushed with dry nitrogen gas at atmospheric pressure. Ten ml of 2-methylaziridine was added dropwise to the $SO_2$ over a five-minute period. After the addition was completed, the contents of the reaction tube was opened to the atmosphere and allowed to warm to room temperature. The reaction mixture became viscous, then solid, as the excess sulfur dioxide was allowed to escape. The solid residue was vacuum-dried at room temperature for evaluation.

The 2-methylaziridine sulfur dioxide copolymer vacuum-dried as above was dissolved in methyl alcohol (15% solids), and the solution spin-coated onto a nickel surface to give films about 1 μm thick. The film samples were exposed to a beam of electrons at a dose of 1.0, 10.0, and 40.0 $\mu C/cm^2$ with a 10 Kev charge on the glass envelope through a low resolution mask having 3 mm bars and 3 mm spaces. The exposed films were developed with the solvent developers listed below for one minute, rinsed with acetone and blown dry with dry nitrogen.

With the films exposed at a dose of 40 $\mu C/cm^2$ the following results were obtained.

| Developer | Results |
|---|---|
| Methanol | stripped film |
| Ethanol | stripped film |
| Iso-propanol | high erosion |
| 1-Propanol | good developer - sharp delineation of pattern |
| 1-Butanol | good developer - sharp delineation of pattern |
| sec-Butanol | best developer - very sharp delineation of pattern |
| tert-Butanol | poor differential solubility - blistered film |
| Dimethylformamide | stripped film |
| Acetone | no development |
| Nitromethane | no development |
| Chloroform | no development |
| Cyclohexanone | no development |

The films which were exposed at 10 $\mu C/cm^2$ were developed with the following developers.

| Developer | Results |
|---|---|
| 1-Propanol | good development |
| 1-Butanol | good development |
| sec-Butanol | best development - test sample had sharp delineation |

The films exposed at 1 $\mu C/cm^2$ were developed with sec-butanol and 1-propanol. The film developed with 1-propanol has a somewhat fuzzy edge. The film developed with sec-butanol has a sharp delineation of the pattern.

What is claimed is:

1. The method of forming a predetermined surface relief pattern in a film of a resist material, said method comprising the steps of
(a) providing a film of a positive resist material which is comprised of a copolymer of
   (1) an aziridine monomer of the formula

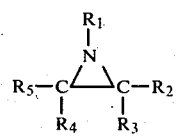

wherein $R_1-R_5$ are the same or different and are members selected from the group consisting of hydrogen, alkyl, aralkyl and aryl, and (2) sulfur dioxide on a substrate, (b) exposing a portion of the film corresponding to said predetermined pattern to radiation which changes the solubility of the exposed portion with respect to the unexposed portion, and (c) dissolving the more soluble portion of the film in a developer to provide said relief pattern.

2. The method according to claim 1 wherein the alkyl has 1-12 carbon atoms, the aralkyl has 7-12 carbon atoms and the aryl has 6-12 carbon atoms.

3. The method according to claim 1 wherein $R_1-R_5$ are selected from the group consisting of hydrogen and lower alkyl having 1-4 carbon atoms.

4. The method according to claim 3 wherein said radiation is an x-ray radiation and at least one of the substituents $R_1-R_5$ is a lower alkyl which is substituted with a halogen.

5. The method according to claim 4 wherein the halogen is chlorine.

6. The method according to claim 1 wherein said radiation is in the form of a beam of electrons.

7. The method according to claim 1 wherein the radiation is x-rays.

8. The exposed developed film prepared in accordance with the process of claim 1.

* * * * *